(12) United States Patent
Sanchez et al.

(10) Patent No.: US 9,356,577 B2
(45) Date of Patent: May 31, 2016

(54) MEMORY INTERFACE RECEIVERS HAVING PULSED CONTROL OF INPUT SIGNAL ATTENUATION NETWORKS

(71) Applicants: Hector Sanchez, Cedar Park, TX (US); Gayathri A. Bhagavatheeswaran, Austin, TX (US)

(72) Inventors: Hector Sanchez, Cedar Park, TX (US); Gayathri A. Bhagavatheeswaran, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 114 days.

(21) Appl. No.: 14/457,508

(22) Filed: Aug. 12, 2014

(65) Prior Publication Data

US 2016/0049922 A1 Feb. 18, 2016

(51) Int. Cl.
| | | |
|---|---|---|
| H03L 5/00 | (2006.01) |
| H03H 11/24 | (2006.01) |
| G11C 11/4093 | (2006.01) |
| H03K 5/08 | (2006.01) |

(52) U.S. Cl.
CPC ........... *H03H 11/24* (2013.01); *G11C 11/4093* (2013.01); *H03K 5/084* (2013.01)

(58) Field of Classification Search
CPC .............................. H03H 11/24; H03K 5/084
USPC .......................................................... 327/308
See application file for complete search history.

(56) References Cited

U.S. PATENT DOCUMENTS

| | | | | |
|---|---|---|---|---|
| 5,974,040 A * | 10/1999 | Kimura | ................ | H03G 3/3068 370/337 |
| 6,236,242 B1 | 5/2001 | Hedberg | | |
| 6,301,486 B1 * | 10/2001 | Tanaka | ................ | H03G 3/3047 455/126 |
| 6,590,436 B2 * | 7/2003 | Jordanger | ........... | H03F 3/45959 327/333 |
| 6,768,352 B1 | 7/2004 | Maher et al. | | |
| 6,771,127 B2 | 8/2004 | Mulder et al. | | |
| 6,844,762 B2 * | 1/2005 | Sanchez | ................. | H03K 4/023 327/157 |
| 7,675,380 B2 * | 3/2010 | Chiu | ........................ | H03H 7/24 327/308 |

(Continued)

OTHER PUBLICATIONS

Zhuang et al., "Linear Equalization and PVT-Independent DC Wander Compensation for AC-Coupled PCIe 3.0 Receiver Front End", IEEE Transactions on Circuits and Systems, Express Briefs, vol. 58, No. 5, May 2011, 5 pgs.

(Continued)

*Primary Examiner* — Ryan Jager

(57) ABSTRACT

Receivers for memory interfaces and related methods are disclosed having pulsed control of input signal attenuation networks. Embodiments include a DC common mode attenuation network, an AC coupling network, a pulse generator, and an amplifier. The pulse generator receives the output of the amplifier and generates a pulse signal that in part controls the operation of the attenuation network. The attenuation network generates an attenuated signal having reduced DC common mode levels. This attenuated signal is combined with an AC component passed by the AC coupling network. The resulting combined signal is detected and amplified by the amplifier. Different voltage domains are used for the attenuation network and the AC coupling network as compared to the amplifier and the pulse generator. By attenuating DC common mode levels while maintaining AC signal levels, the disclosed embodiments allow for proper signal detection over a wide range of DC common mode levels.

20 Claims, 5 Drawing Sheets

(56) References Cited

U.S. PATENT DOCUMENTS

| | | | |
|---|---|---|---|
| 7,720,141 | B2 | 5/2010 | Fang et al. |
| 8,451,044 | B2 * | 5/2013 | Nisbet ................. H03K 17/687 327/308 |
| 8,638,155 | B2 * | 1/2014 | Notman .............. H02M 3/1588 327/308 |
| 2008/0063091 | A1 | 3/2008 | Dong et al. |
| 2010/0134218 | A1 * | 6/2010 | Kobayashi ............ H03H 11/24 333/81 R |
| 2011/0148501 | A1 * | 6/2011 | Granger-Jones ..... H03H 11/245 327/308 |
| 2012/0139633 | A1 * | 6/2012 | Nasu .................... H03F 1/0277 330/254 |
| 2012/0161875 | A1 * | 6/2012 | Trulls Fortuny ..... H03G 1/0029 330/284 |
| 2013/0090077 | A1 * | 4/2013 | Rozenblit ............. H04W 52/52 455/127.2 |

OTHER PUBLICATIONS

Fang et al., "A 5.2Gbps HyperTransport Integrated AC Coupled Receiver With DFR DC Restore", Symposium on VLSI Circuits Digest of Technical Papers, 2007, 2 pgs.

Sohn et al., "A 1.2 V 30 nm 3.2 Gb/s/pin 4 Gb DDR4 SDRAM With Dual-Error Detection and PVT-Tolerant Data-Fetch Scheme", IEEE Journal of Solid-State Circuits, vol. 48, No. 1, Jan. 2013, 10 pgs.

Mick et al., "4 Gbps High-Density AC Coupled Interconnection", IEEE Custom Integrated Circuits Conference, 2002, 8 pg.s.

Maillard et al., "An 8-Gb/s Capacitively Coupled Receiver With High Common-Mode Rejection for Uncoded Data", IEEE Journal of Solid-State Circuits, vol. 39, No. 11, Nov. 2004, 7 pgs.

Gabara et al., "Capacitive Coupling and Quantized Feedback Applied to Conventional CMOS Technology", IEEE Journal of Solid-State Circuits, vol. 32, No. 3, Mar. 1997, 9 pgs.

* cited by examiner

MEMORY INTERFACE RECEIVERS HAVING PULSED CONTROL OF INPUT SIGNAL ATTENUATION NETWORKS

TECHNICAL FIELD

This technical field relates to signal interfaces for memory integrated circuits.

BACKGROUND

Traditional receiver circuits for dual data rate (DDR) dynamic random access memory (DRAM) devices typically operate at a fixed DC common mode of 0.5 times GVDD, where GVDD is the DDR IO (input/output) supply voltage level defined by the DDR interface specification. This fixed DC common mode has been used for DDR1-DDR3 protocols. To enhance the power performance of DDR interfaces, however, the DDR4 specification terminates the data lines at GVDD instead of GVDD/2. As such, the DC common mode for the data lines is shifted towards 0.75 times GVDD with the upper end for the DC common mode being about 0.92 times GVDD. At the same time, the low end for the DC common mode is shifted down to about 0.45 times GVDD. In addition to this expanded range for DC common mode levels, the high-to-low voltage swings for the data signals within the DDR4 specification can range from 0.08 times GVDD to about 0.8 times GVDD. These new DDR4 interface specifications can lead to combinations that create significant detection problems for standard differential data receivers. One such combination is where a relatively low high-to-low data swing such as 0.08 times GVDD is used in combination with a relatively high DC common mode such as 0.92 times GVDD. And at the other extreme is a relatively high data swing such as 0.8 times GVDD in combination with a relatively low DC common mode such as 0.45 times GVDD.

FIG. 7 (Prior Art) provides a voltage level signal diagram 700 that represents the two extreme conditions set forth above. A first input signal (INPUT 1) 702 represents the first example above, and a second input signal (INPUT 2) represents the second example above. The DC common mode variation 706 ranges from 0.92 times GVDD to 0.45 GVDD, and the signal voltage swings vary from 0.08 times GVDD to 0.8 times GVDD. Other DC common mode voltages levels and signals swings can also be used between these extremes according to the DDR4 interface specification.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

DETAILED DESCRIPTION

Methods and systems are disclosed for receivers for memory interfaces having pulsed control of input signal attenuation networks. Embodiments include a DC common mode attenuation network, an AC coupling network, a pulse generator, and an amplifier. The pulse generator receives the output of the amplifier and generates a pulse signal that in part controls the operation of the attenuation network. The DC common mode attenuation network attenuates the input signal to generate an attenuated signal having reduced DC common mode levels. This attenuated signal is combined with an AC component passed by the AC coupling network. The resulting combined signal is provided to the amplifier that detects the signal levels and generates an amplified output signal representing the detected input signal. In addition, different voltage domains are used for the DC common mode attenuation network and the AC coupling network as compared to the amplifier and the pulse generator. In further embodiments, switches within the attenuation network are controlled by the pulse signal so that they are turned on when the output signal is not transitioning and turned off while the output signal is transitioning. This pulsed control of the attenuation network allows for the voltages to settle more quickly while still maintaining interface impedance and operational requirements. Advantageously, the disclosed embodiments attenuate DC common mode voltage levels to help center voltage levels for the amplifier operation while still maintaining AC signal levels to provide full swing voltages to be coupled to the amplifier, thereby allowing for proper detection by the amplifier over a wide range of DC common mode levels for the input signals. Different features and variations can be implemented, as desired, and related or modified systems and methods can be utilized, as well.

As further described herein, the disclosed embodiments avoid the use of elevated IO (input/output) interface supply voltage levels while shifting DC common mode and data signal swings to lower voltage levels so that data signals can be accurately detected. In part, the disclosed embodiments can be used to receive data signals from DDR (dual data rate) dynamic random access memory (DRAM) interfaces that operate according to the DDR4 interface specifications. Advantageously, the disclosed embodiments allow for use of thin-oxide FETs (field effect transistors) and lower supply voltage levels (VDD) for receiver circuitry by avoiding the use of the higher interface voltage levels for DDR4 input/output (JO) interfaces (e.g., GVDD voltage levels). Further, the disclosed embodiments provide a relatively small design that is fast and efficient and that can be applied to single-ended or differential input signals, and other variations can also be implemented as desired.

Figure 1:
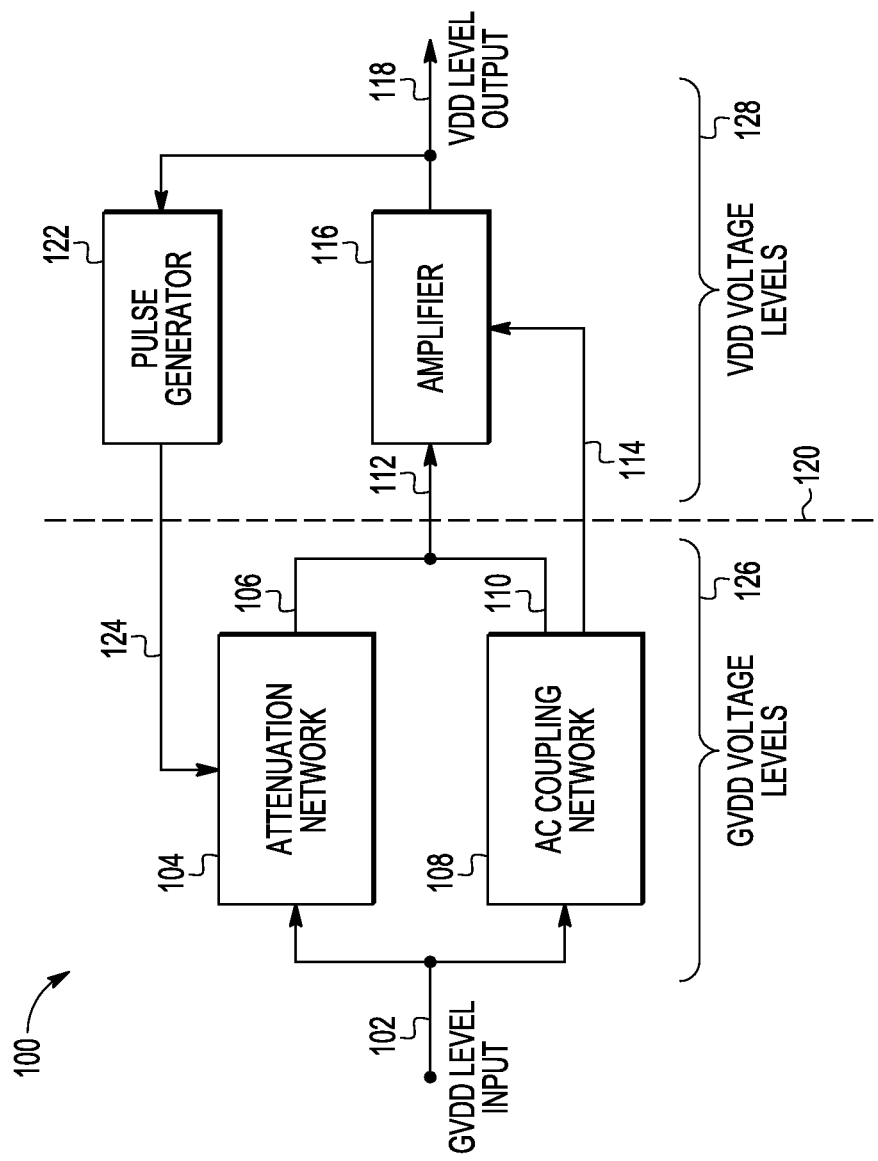
FIG. 1 is a block diagram of an example embodiment for a receiver for a memory interface that includes pulsed control of an input signal attenuation network.

FIG. 1 is a block diagram of an example embodiment 100 for a receiver that includes an attenuation network 104 that is in part controlled by pulse signal 124 from pulse generator 122 and that attenuates DC common mode voltage levels and signal swing voltage levels around the DC common mode voltage levels. An AC coupling network 108 is also provided. The input signal 102, such as a GVDD level input signal associated with DDR4 signals, is coupled to the attenuation network 104 and to the AC coupling network 108. The attenuated signal 106 with attenuated DC common mode and signal swing voltage levels from the attenuation network 104 is combined with the AC component signal 110 output by the AC coupling network 108 to form combined signal 112. A combiner can be used, if desired, to combine the attenuated signal 106 and the AC component signal 110, or the two signals can simply be coupled to a common node. Other combining techniques could also be used. The resulting combined signal 112 is provided to amplifier 116. The amplified output signal 118 is then output by the amplifier 116 at lower voltage levels (e.g., VDD voltage levels, where VDD is an internal supply voltage level for an integrated circuit). As described further below, a pulse generator 122 is be used to receive the output 118 and to provide a pulse signal 124 to attenuation network 104 to at least in part control the operation of the attenuation network 104. In addition, the AC coupling network 108 can also provide an AC component signal 114 to the amplifier 116 that is attenuated.

It is noted that the circuitry to the left of the dashed line 120 is passive circuitry that is connected within the high voltage level domain 126, such as a GVDD voltage domain, and the circuitry to the right of dashed line 120 includes passive and active circuitry that operates in a lower level voltage domain 128, such as the VDD voltage domain. As one example, the GVDD voltage domain 126 can be configured to have a high voltage supply level of 1.8 volts and a low voltage supply level of ground (i.e., 0 volts), and the VDD voltage domain 128 can be configured to have a high voltage supply level of 1.0 volts and a low voltage supply level of ground (i.e., 0 volts).

In operation, the attenuation network 104 attenuates the DC common mode and signal swing voltage levels of the input signal 102 to reduce these voltage levels (e.g. DC common mode and signal swing around the DC common mode within the input signal 102) by a percentage of the original voltage levels and to provide these reduced voltage level signals as attenuated signals 106. For example, where GVDD voltage levels are used, the attenuation network 104 reduces the DC common mode voltage level by a percentage of the original DC common mode voltage level and also reduces the data signal swing around this DC common mode voltage by this percentage. For example, if the input signal has a DC common mode level of 1.6 volts and a signal swing from 1.5 volts to 1.7 volts and if the attenuation network 104 is configured to attenuate by 50%, the attenuation network 104 will couple an attenuated output signal 106 that has a DC common mode level of 0.8 volts and a signal swing from 0.75 to 0.85 volts. It is noted that these values provide one example and that other voltage levels and attenuation amounts could be utilized.

The AC coupling network 108 operates to couple the signal swings of the input signal 102 to output 110 by blocking the DC component of the input signal 102 and passing only an attenuated ratio of the AC component of the input signal 102. As described further below, the AC coupling network 108 can also couple the signal swings of the input signal 102 to output 114 by blocking the DC component of the input signal 102 and passing only an attenuated ratio of the AC component of the input signal 102. For example, if the input signal again has a DC common mode of 1.6 volts and a signal swing from 1.5 volts to 1.7 volts, the AC coupling network 108 can be configured to have a 50% attenuation ratio and can couple an AC component signal to the output 110 and/or the output 114 that has a DC common mode of 0 volts and a signal swing from −0.05 to 0.05 volts. Using these example values and the example values above for the attenuation network 104 where the attenuated signal has a DC common mode level of 0.8 volts and a signal swing from 0.75 to 0.85 volts, the combined signal 112 will have a DC common mode of 0.8 volts and a signal swing from 0.70 to 0.90 volts. Again, it is noted these value provide one example and that other voltage levels and attenuation amounts could be utilized.

It is further noted that "DC common mode" as used herein refers to the average voltage level between a high voltage level and the low voltage level for the voltage level swings of the signal being communicated through a signal line interface. It is also noted that "DC" as used herein refers to the voltage level of the signal as compared to ground or 0 volts and that "AC" as used herein refers to the signal swings from high-to-low and from low-to-high around the DC common mode voltage level.

Figure 2:
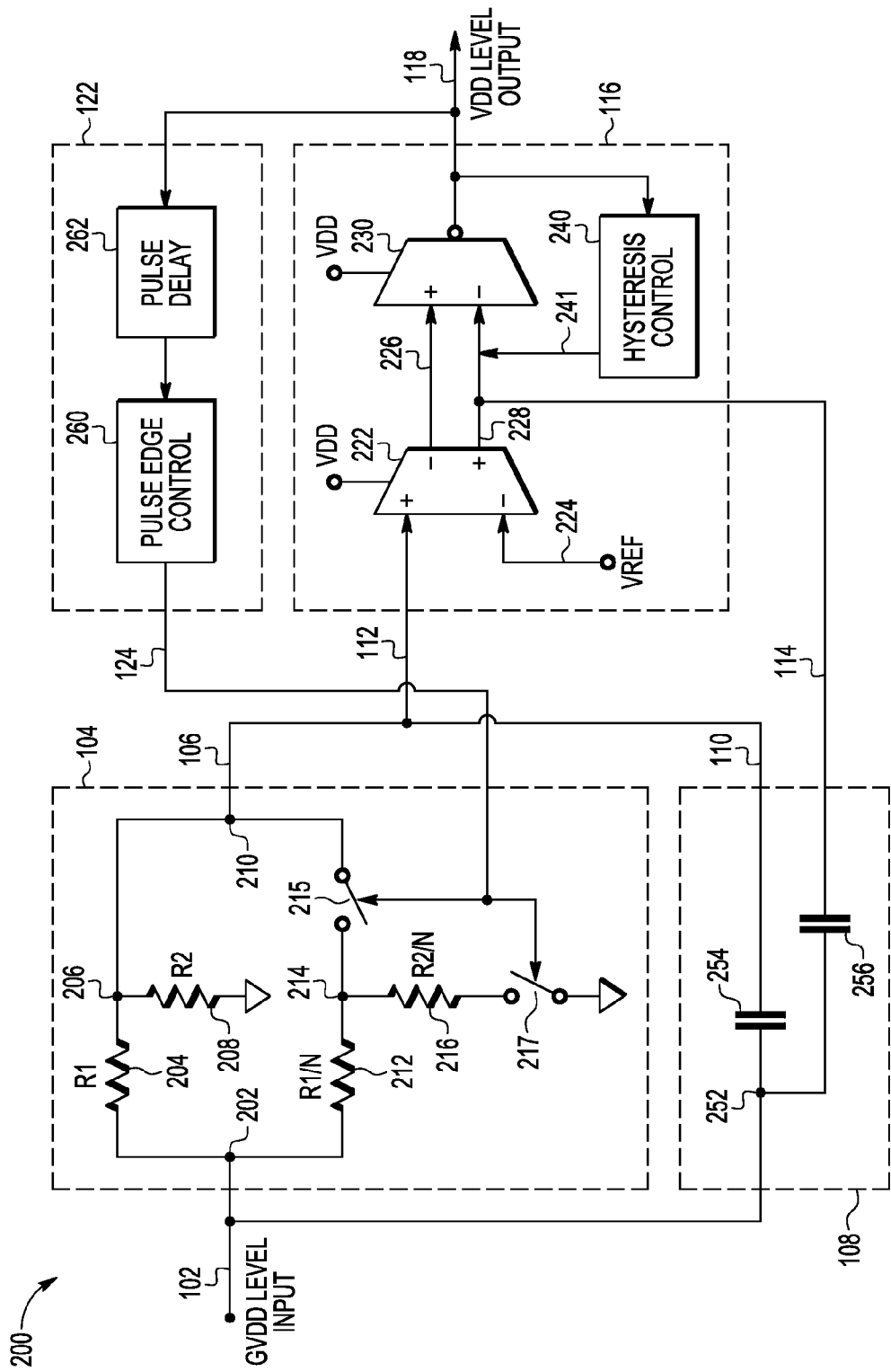
FIG. 2 is block diagram of an example embodiment for a receiver that includes a resistor attenuation network for DC common mode attenuation, capacitor coupling for an AC coupling network, a two-stage amplifier, and a pulse generator including a pulse delay and edge width control circuitry.

FIG. 2 is block diagram of an example embodiment 200 for a receiver that includes a resistor network for attenuation network 104 combined with capacitor coupling for the AC coupling network 108. Further, embodiment 200 includes a two-stage amplifier for amplifier 116, a pulse delay block 262 within pulse generator 122, and a pulse edge control block 260 within the pulse generator 122. Embodiment 200 also uses GVDD levels as the input voltage levels for input signal 102 and uses VDD levels as the output voltage levels for output signal 118.

Looking first to the resistor attenuation network 104, node 202 is coupled to receive the GVDD level input signal 102. The input signal 102 is passed through a first resistor divider network that includes resistor (R1) 204 and resistor (R2) 208 for the example embodiment 200. A second resistor divider network is connected in parallel with the first resistor network and includes resistor (RUN) 212 and resistor (R2/N) 216 for the example embodiment 200. The first resistor (R1) 204 is coupled between node 202 and node 206, and the second resistor (R2) 208 is coupled between node 206 and ground. Output node 210 is also coupled to node 206. A pulse controlled network is coupled between node 202 and node 210 and includes switches 215 and 217 that are controlled by pulse signal 124. The resistor (RUN) 212 is coupled between node 202 and node 214, and switch 215 is coupled between node 214 and node 210. The resistor (R2/N) 216 is coupled between node 214 and ground through switch 217. Resistor 212 can be, for example, 1/N times the impedance of resistor (R1) 204. Similarly, resistor 216 can be, for example, 1/N times the impedance of resistor (R2) 208. As such, the second resistor network (e.g., resistors 212/216) provides impedances that are proportionally lower than the impedances for the first resistor network (e.g., resistors 204/208). The value of N can be a selected integer, and N can be selected to be 10 (e.g., N=10) for one embodiment.

It is noted that the amount of attenuation (ATT) provided by the attenuation network 104 is determined by the impedance values selected for R1 and R2 as the resistor divider networks provided by resistors 204/208 and 212/216 each provide an attenuation (ATT) set by the divider ratio: R2/(R1+R2). For example, if R1 and R2 are selected to be equal impedance values, then the attenuation (ATT) is 50% (e.g., ATT=R2/2R2=0.50). It is further noted that the first resistor network (e.g., resistors 204/208) or the second resistor network (e.g., resistors 212/216) or both resistor networks can be implemented using one or more programmable variable impedances so that the divider ratios and thereby the attenuation amount for the attenuation network 104 is programmable. For example, a bank of resistors that can be switched into or out of operation can be used to implement a programmable variable impedance. Other resistor networks, switch locations, relative impedance values, and/or variations could also be utilized.

In operation, switches 215/217 are controlled by pulse signal 124 so that they are closed at the same time and are open at the same time. As such, the resistors 212 and 216 are active within the resistor network when switches 215/217 are closed and are inactive within the resistor network when switches 215/217 are open. It is noted that the switches 215 and 217 can be implemented, for example, using N-channel metal-oxide-semiconductor (MOS) FETs and/or some other desired switching circuitry. Further, it is noted that while switches 215/217 are located in the GVDD voltage level domain 126, the gates for these switches 215/217 are coupled to the pulse signal 124 that is within the VDD voltage level domain 128. As described above, the pulse signal 124 is within the VDD voltage level domain 128 as it is generated by pulse generator 122 that operates in the VDD voltage level domain 128 as shown in FIG. 1. It is also noted that switch 215/217 can be implemented as high voltage protected thin oxide field effect transistors (FETs) to avoid the use of thick oxide FETs. Other variations could also be implemented.

Looking now to the AC coupling network 108, two capacitors 254 and 256 are used to provide the AC component output signals 110 and 114. Node 252 is coupled to receive the GVDD level input signal 102. Capacitor 254 is coupled to node 252 and provides output signal 110, and capacitor 256 is coupled to node 252 and provides the output signal 114. As described above, these capacitors 254/256 couple the AC component of the input signal 102 as output signals 110 and 114, respectively, while blocking the DC component of the input signal 102. It is noted that the AC component passed will be a ratio of the data signal swing based upon the capacitance of capacitors 254/256 and the parasitic capacitance of the internal nodes carrying output signals 110/114. Further, the AC coupling network 108 can be implemented using one or more programmable variable capacitances so that the capacitance and thereby the attenuation amount for the AC component passed as output signal 110 and/or the AC component passed as output signal 114 is programmable. For example, a bank of capacitors that can be switched into or out of operation can be used to implement a programmable variable capacitance. Other capacitors, capacitor networks, and/or variations could also be utilized.

The pulse generator 122 can include pulse delay circuitry 262 that receives the output signal 118 and provides a delayed signal to pulse edge control circuitry 260. Pulse edge control circuitry 260 then generates a pulse signal 124 that is used to control the switches 215/217 within the attenuation network 104. The pulsed control of the resistor attenuation network 104 allows for more rapid settling of voltage levels while still meeting impedance requirements for the input signal interface.

The amplifier 116 includes a first differential amplifier stage 222 and a second differential to single-ended amplifier stage 230 that are each operating at VDD voltage levels. For the embodiment depicted, the combined signal 112 is received at the positive (+) input of the differential amplifier stage 222, and a reference voltage (VREF) 224 is received at a negative (−) input of the differential amplifier stage 222. The negative (−) output from differential amplifier stage 222 is coupled to the positive (+) input of the second amplifier stage 230, and the positive (+) output from the differential amplifier stage 222 is coupled to the negative (−) input of the second amplifier stage 230. The AC component output 114 from the AC coupling network 108 is also coupled to the negative (−) input of the second amplifier stage 230. The output of the second amplifier stage 230, which can be inverted, provides the VDD level output 118.

It is noted that hysteresis control circuitry 240 can also be included as part of amplifier 116 to stabilize the operation of amplifier 116 and to avoid data dependent wander. Hysteresis control circuitry 240 receives the output 118 and provides a hysteresis feedback signal 241 to the negative (−) input of the second amplifier stage 230. In one example implementation, the hysteresis control circuitry 240 can be configured to provide a reduced voltage level inverted version of the output 118 as the hysteresis feedback signal 241.

It is further noted that for some embodiments resistor (R1) 204 and resistor (R2) 208 can be set to be equal impedance values. For example, these resistors can have equal impedance values between 40-100 kilo-Ohms, although other impedance values could also be used. In further embodiments, resistors 212 and 216 can also be equal impedance values and can be set to be 1/N times the impedance values for resistors (R1, R2) 204/208, respectively. For such an embodiment, therefore, resistor 212 would be 1/N times the impedance of resistor (R1) 204, and resistor 216 would be 1/N times the impedance of resistor (R2) 208. For one embodiment, N can be set to be ten (10).

As described above, the relative impedance values for resistor (R1) 204 and resistor (R2) 208 determine the amount of attenuation provided by the attenuation network 104 for embodiment 200. If the impedance values are equal (i.e., R1=R2), then the attenuation will be 50 percent. Other attenuation amounts can also be selected and used, as desired, by adjusting the relative impedance values for resistors (R1, R2) 204/208 as the attenuation for embodiment 200 is proportional to R2/(R1+R2). It is further noted that other resistor networks could also be utilized.

The relative impedance values for resistors 212 and 216 determine how quickly voltage levels within the attenuation network 104 settle to their steady-state values. The smaller the resistors 212/216 are made, the more quickly this settling will occur. Further, resistors 212 and 216 can be made proportional to resistors 204 and 208, respectively, to help maintain the attenuation amount set by R1 and R2. Variations could also be implemented.

With respect to DDR4 implementations, resistors (R1, R2) 204/208 are used to satisfy leakage current specifications (e.g., 50 uA total) for input/output operations for the DDR4 interface. However, these resistors are not able to fully charge/discharge the combined signal 112 at high speeds at the bit rate provided by the DDR4 specification. As such, the smaller resistors 212/216 are enabled momentarily between voltage transitions for bit switching to drive the combined signal 112 appropriately to target voltages. In operation, therefore, the resistor network provided by resistors (R1,R2) 204/208 controls the effective attenuation factor, and the resistors 212/216 help voltage settling and are preferably enabled during the pulse window for pulse signal 124.

Figure 3:
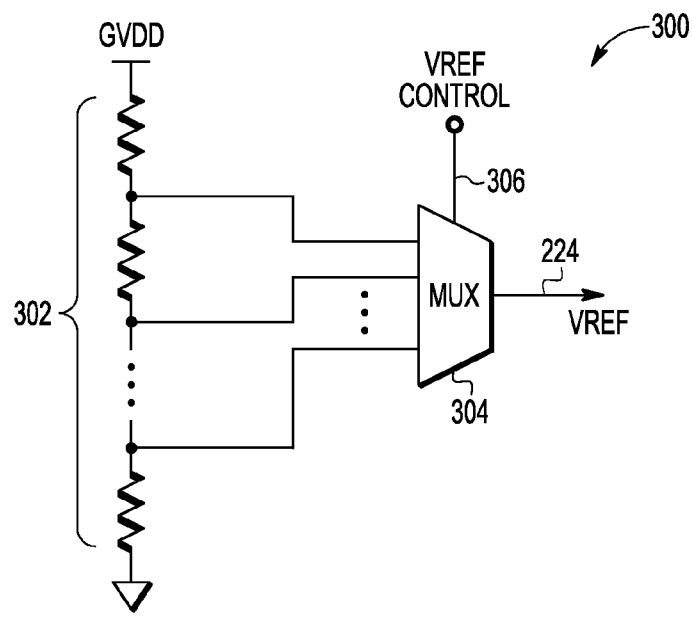
FIG. 3 is a circuit diagram of an example embodiment for a reference voltage generator that can be used to generate a reference voltage (VREF).

FIG. 3 is a circuit diagram of an example embodiment 300 for a reference voltage generator that can be used to generate the reference voltage (VREF) 224 for embodiment 200. For example embodiment 300, a series of resistors 302 between the GVDD supply voltage level and ground generates multiple voltage levels that are provided to multiplexer (MUX) 304. A reference voltage (VREF) control signal 306 is then applied to MUX 304 to select one of these voltage levels to output as the voltage reference (VREF) 224. As such, the reference voltage (VREF) 224 is programmable based upon the control signal 306. The control signal 306 can be provided by control circuitry included within the integrated circuit also include the receiver embodiment 200, and the control circuitry can be a microcontroller, logic circuitry, and/or other desired circuitry configured to provide the control signal 306. Other reference voltage generator implementations could also be utilized to provide the reference voltage (VREF) 224.

Figure 4:
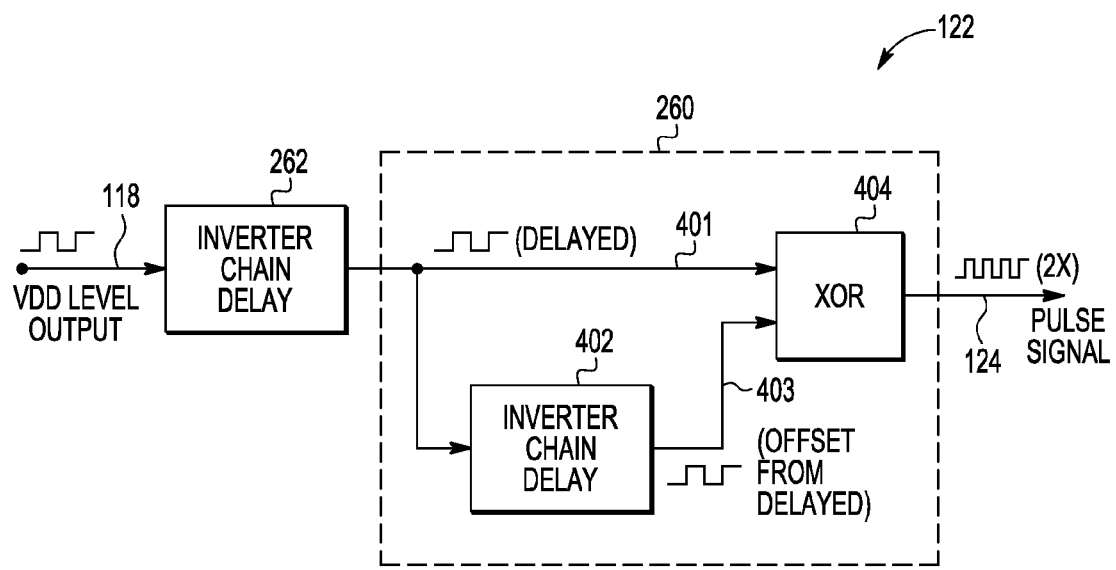
FIG. 4 is a block diagram of an example embodiment for a pulse generator.

FIG. 4 is a block diagram of an example embodiment for pulse generator 122 including pulse delay circuitry 262 and pulse edge control circuitry 260. For this example embodiment, the pulse delay circuitry 262 is implemented using an inverter chain that can in turn be implemented by connecting an even number of inverters in series. The output 401 of this inverter chain delay block 260 is provided to another inverter chain delay block 402 that can also be implemented by connecting an even number of inverters in series. Within the pulse edge control circuitry 260, the output 401 and the output 403 of block 402 are provided to XOR logic circuitry 404. XOR logic circuitry 404 outputs a logic zero when the logic levels for both inputs match and outputs a logic one when the logic levels for both input do not match. The pulse signal 124 is output by the XOR logic circuitry 404.

In operation, the inverter chain delay block 262 delays the edges of the VDD level output signal 118 by an amount that depends upon the switching speed of the invertors and the number of inverters used for block 262. Similarly, within the pulse edge control block 260, the inverter chain delay block 402 further delays this delayed signal to generate an offset signal 403, and this further delay depends upon the switching speed of the invertors and the number of inverters used for block 402. The delays for block 262/402 can be configured so that the pulse signal 124 has a pulse for each logic one and for each logic zero within the output signal 118. The XOR logic circuitry 404 provides this result as a logic zero is output when the signals 401/403 match and a logic one is output when the signals 401/403 do not match. The delay provided by block 402 can be configured so that offset signal 403 transitions at an offset less than one-half cycle for the output signal 118. As such, the XOR logic circuitry 404 will produce a pulse signal 124 that has two pulses for each cycle of the output signal 118 and therefore operates at twice (2×) the speed of the output signal 118. It is noted that the delays provided by blocks 262/402 can also be configured so that the pulses within the pulse signal 124 align with the logic highs and logic lows of the output signal 118, as shown below with respect to FIG. 5. It is further noted that in one embodiment, four inverters are used for block 262, and ten inverters are used for block 402. It is further noted that the delay provided by block 262, by block 402, or by both blocks 262 and 402 can also be programmable such that the pulse widths can be adjusted based upon data rates. For example, a programmable variable load can be provided for one or more of the inverters used in block 262 and/or block 402 so that the delay for these blocks is programmable. Other variations could also be implemented.

Figure 5:
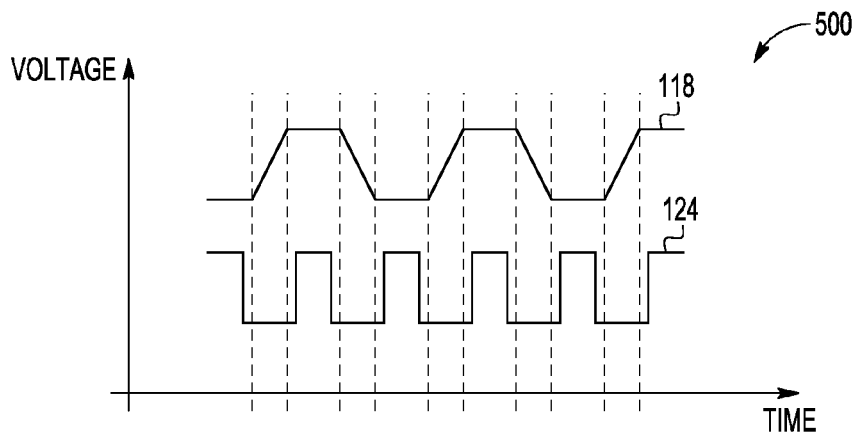
FIG. 5 is a signal diagram of an embodiment that shows a pulse signal for attenuation control with respect to an output signal.

FIG. 5 is a signal diagram of an embodiment 500 that shows the pulse signal 124 with respect to the output signal 118. As shown, the pulse signal 124 includes a pulse within each logic high and each logic low for the input signal 118. It is noted that the pulses for pulse signal 124 are preferably configured using the pulse generator 122 such that the pulse signal 124 is at a low logic level during the voltage transitions for the output signal 118. For the embodiment 500, it is assumed that the switches 215/217 will be closed when the pulse signal 124 is at a high logic level and will be open when the pulse signal 124 is at a low logic level. As such, the switches will be open during any voltage transition for output signal 118 will be closed when output signal 118 is high or low and not transitioning.

As described herein, the pulsed attenuation network 104 controlled using the pulse signal 124 provides a number of advantages. In part, the pulsed attenuation network 104 stabilizes the input signal to a target attenuation voltage while shifting the DC common mode from a high voltage level to mid-DC common mode voltage level relative to the VDD voltage level domain 128. This shift in part provides voltage protection so that thin-oxide FETs can be used within the receiver. Further, the pulse delay block 262 helps to ensure that the output 118 has actually transitioned and has not simply glitched, and the pulse edge control block 260 controls the width of the pulse to help to ensure that the pulse has both engaged for a long enough time as well as shut-off in time to avoid the next signal transition.

Figure 6:
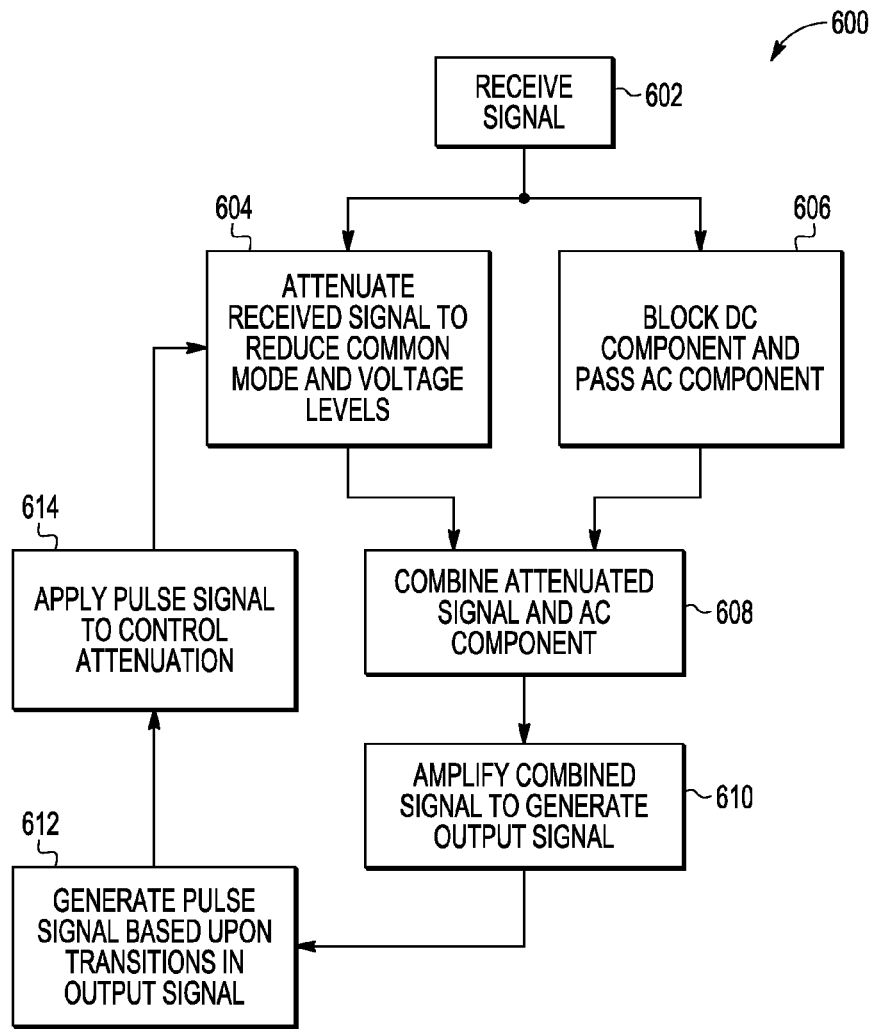
FIG. 6 is a process diagram of an embodiment for receiving signals using a DC common mode attenuation network combined with an AC coupling network.
Figure 7:
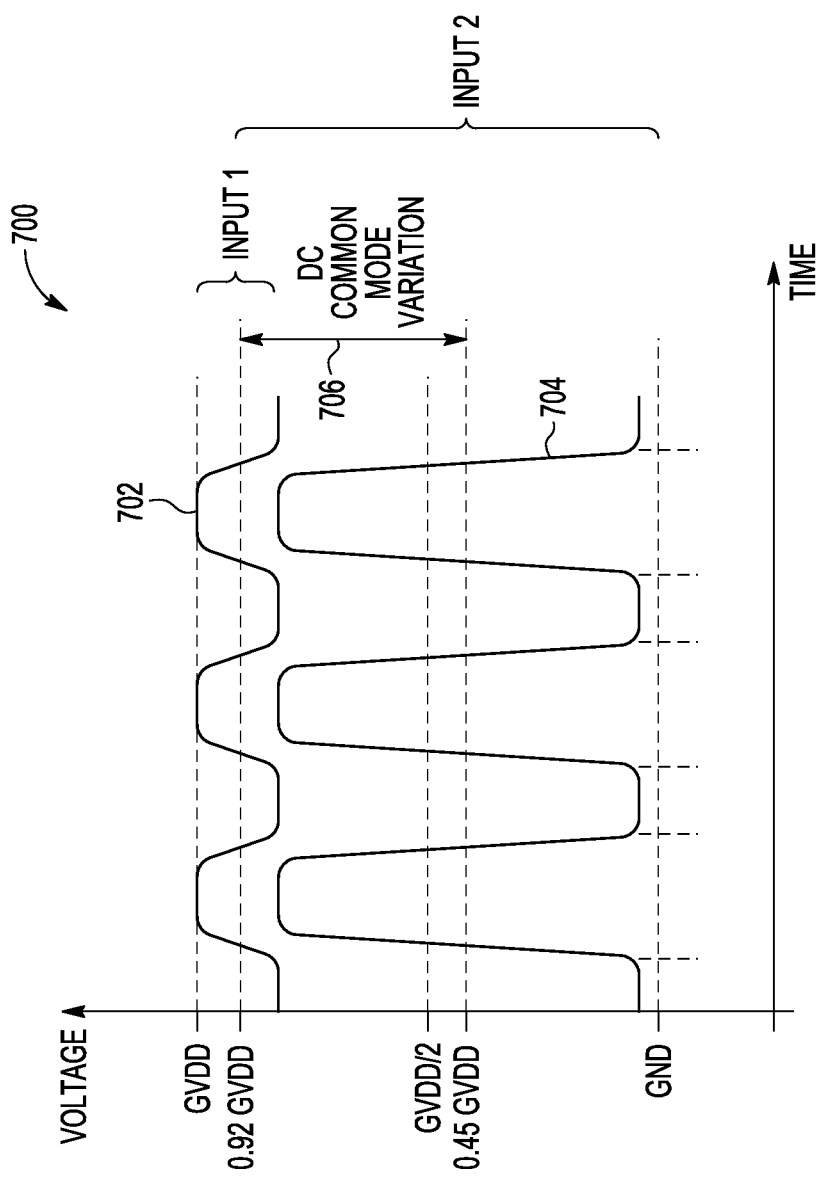
FIG. 7 (Prior Art) provides a voltage level signal diagram that represents two extreme conditions for input signals.

FIG. 6 is a process diagram of an embodiment 600 for receiving signals using a pulse-controlled attenuation network combined with an AC coupling network. In block 602, the input signal is received. In block 604, the received signal is attenuated to reduce the DC common mode voltage level and the signal swing voltage levels. For example, as described herein, a resistor divider network can be used to provide this attenuation. At the same time, in block 606, the DC component of the input signal is blocked, and the AC component is passed. For example, as described herein, capacitors can be used to provide this AC coupling, and the AC component passed will be a ratio of the data signal swing based upon the capacitance of capacitors (e.g., capacitor 254) and the parasitic capacitance of internal node (e.g., node carrying signal 110). In block 608, the attenuated signal and the AC component of the received signal are combined. In block 610, the combined signal is detected and amplified to generate an output signal. In block 612, a pulse signal is generated based upon transitions in the output signal. In block 614, the pulse signal is applied to control the operation of the attenuation network in block 604. As described above with respect to FIG. 2, the pulse signal can be applied to a low impedance network (e.g., resistors 212 and 216) with a same attenuation ratio as a high impedance network (e.g., resistors 204 and 208) to drive the internal attenuated signal at node 106 to a desired DC attenuation ratio at high speeds. As described above, this activation of a parallel high-speed, low-impedance attenuation path using the pulse signal allows for the voltages to settle more quickly while still maintaining interface impedance and operational requirements It is further noted that different and/or additional process steps can also be used, and variations can be implemented as desired.

As described herein, a variety of embodiments can be implemented and different features and variations can be implemented, as desired.

For one embodiment, an interface receiver is disclosed that includes an attenuation network coupled to receive an input signal having a voltage swing around a DC common mode voltage level within a first voltage domain where the attenuation network is configured to attenuate the DC common mode voltage level and the voltage swing for the input signal and to output an attenuated signal, an amplifier configured to receive the attenuated signal and to output an amplified signal within a second voltage domain, and a pulse generator configured to generate a pulse signal within the second voltage domain based upon the amplified signal and to provide the pulse signal to the attenuation network to at least in part control operation of the attenuation network, where the second voltage domain has a lower supply voltage level than the first voltage domain. In further embodiments, the first voltage domain is a voltage domain for a memory interface for an integrated circuit, and the second voltage domain is a voltage domain for additional circuitry within the integrated circuit.

In other embodiments, the pulse signal is coupled to control one or more switches within the attenuation network. In addition, the attenuation network can further include a first resistor divider network coupled between an input node for the input signal and an input node for the amplifier and a second resistor divider network coupled between the input node for the input signal and the input node for the amplifier, and the second resistor divider network is connected or disconnected within the attenuation network based upon the switches within the attenuation network. Further, impedances for the second resistor divider network can be proportionally lower than impedances for the first resistor divider network. Still further, the pulse signal can be configured to control the switches such that the second resistor divider network is connected while the input signal is not transitioning and is disconnected while the input signal is transitioning. In other embodiments, at least one of the first resistor divider network and the second resistor divider network includes one or more variable impedances, and each variable impedance is programmable to select an attenuation amount for the attenuation network.

In further embodiments, the interface receiver further includes an AC coupling network coupled to receive the input signal and configured to output an AC component of the input signal, and the amplifier is configured to receive a combined signal including the attenuated signal from the attenuation network and the AC component of the input signal from the AC coupling network. In addition, the AC coupling network can include one or more capacitors coupled between an input node for the input signal and an input node for the amplifier. Further, the AC coupling network can include one or more variable capacitances coupled between an input node for the input signal and an input node for the amplifier, and each variable capacitance can be programmable to select an attenuation amount for the AC coupling network. Still further, the amplifier can include a two-stage amplifier, and the AC coupling network can be further configured to provide an AC component of the input signal to an input for a second stage of the two-stage amplifier. In other embodiments, the amplifier can include a differential amplifier stage, and the differential amplifier stage can receive the combined signal as a first input and a programmable reference voltage as a second input.

In still further embodiments, the pulse generator can include pulse delay circuitry configured to determine a first edge for the pulse signal and pulse edge control circuitry configured to determine a second edge for the pulse signal. Further, at least one of the first edge or the second edge can be programmable to adjust a pulse width for the pulse signal.

For another embodiment, a method for operating an interface receiver is disclosed that includes, receiving an input signal having a voltage swing around a DC common mode voltage level within a first voltage domain, passing the input signal through an attenuation network to attenuate the DC common mode voltage level and the voltage swing for the input signal and to output an attenuated signal, amplifying the attenuated signal to output an amplified signal within a second voltage domain, generating a pulse signal within the second voltage domain based upon the amplified signal, and controlling operation of the attenuation network at least in part using the pulse signal, where the second voltage domain has a lower supply voltage level than the first voltage domain.

In other embodiments, the controlling step includes controlling one or more switches within the attenuation network using the pulse signal to connect or disconnect a resistor network within the attenuation network. In further embodiments, the controlling step includes controlling the switches using the pulse signal such that the resistor network is connected while the input signal is not transitioning and is disconnected while the input signal is transitioning. In still further embodiments, the method further includes adjusting one or more impedances within the attenuation network to adjust attenuation provided by the attenuation network.

In further embodiments, the method includes passing the input signal through an AC coupling network to output an AC component of the input signal, and the amplifying step includes amplifying a combined signal including the attenuated signal from the attenuation network and the AC component of the input signal from the AC coupling network. In other embodiments, the method further includes adjusting one or more capacitances within the AC coupling network to adjust attenuation provided by the AC coupling network.

It is noted that the functional blocks, devices, and/or circuitry described herein can be implemented using hardware, software, or a combination of hardware and software. In addition, one or more processing devices executing software and/or firmware instructions can be used to implement the disclosed embodiments. It is further understood that one or more of the operations, tasks, functions, or methodologies described herein can be implemented, for example, as software, firmware and/or other program instructions that are embodied in one or more non-transitory tangible computer readable mediums (e.g., data storage devices, FLASH memory, random access memory, read only memory, programmable memory devices, reprogrammable storage devices, hard drives, floppy disks, DVDs, CD-ROMs, and/or any other tangible storage medium) and that are executed by one or more central processing units (CPUs), controllers, microcontrollers, microprocessors, hardware accelerators, processors, and/or other processing devices to perform the operations and functions described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. An interface receiver, comprising:
   an attenuation network coupled to receive an input signal having a voltage swing around a DC common mode voltage level within a first voltage domain, the attenuation network being configured to attenuate the DC common mode voltage level and the voltage swing for the input signal and to output an attenuated signal;
   an amplifier configured to receive the attenuated signal and to output an amplified signal within a second voltage domain; and a pulse generator configured to generate a pulse signal within the second voltage domain based upon the amplified signal and to provide the pulse signal to the attenuation network to at least in part control operation of the attenuation network;

wherein the second voltage domain has a lower supply voltage level than the first voltage domain.

2. The interface receiver of claim 1, wherein the pulse signal is coupled to control one or more switches within the attenuation network.

3. The interface receiver of claim 2, where in the attenuation network comprises a first resistor divider network coupled between an input node for the input signal and an input node for the amplifier and a second resistor divider network coupled between the input node for the input signal and the input node for the amplifier, the second resistor divider network being connected or disconnected within the attenuation network based upon the switches within the attenuation network.

4. The interface receiver of claim 3, wherein impedances for the second resistor divider network are proportionally lower than impedances for the first resistor divider network.

5. The interface receiver of claim 3, wherein the pulse signal is configured to control the switches such that the second resistor divider network is connected while the input signal is not transitioning and is disconnected while the input signal is transitioning.

6. The interface receiver of claim 3, wherein at least one of the first resistor divider network and the second resistor divider network comprises one or more variable impedances, each variable impedance being programmable to select an attenuation amount for the attenuation network.

7. The interface receiver of claim 1, further comprising an AC coupling network coupled to receive the input signal and configured to output an AC component of the input signal, and wherein the amplifier is configured to receive a combined signal including the attenuated signal from the attenuation network and the AC component of the input signal from the AC coupling network.

8. The interface receiver of claim 7, wherein the AC coupling network comprises one or more capacitors coupled between an input node for the input signal and an input node for the amplifier.

9. The interface receiver of claim 7, wherein the AC coupling network comprises one or more variable capacitances coupled between an input node for the input signal and an input node for the amplifier, each variable capacitance being programmable to select an attenuation amount for the AC coupling network.

10. The interface receiver of claim 7, wherein the amplifier comprises a two-stage amplifier and wherein the AC coupling network is further configured to provide an AC component of the input signal to an input for a second stage of the two-stage amplifier.

11. The interface receiver of claim 7, wherein the amplifier comprises a differential amplifier stage, and wherein the differential amplifier stage receives the combined signal as a first input and a programmable reference voltage as a second input.

12. The interface receiver of claim 1, wherein the pulse generator comprises pulse delay circuitry configured to determine a first edge for the pulse signal and pulse edge control circuitry configured to determine a second edge for the pulse signal.

13. The interface receiver of claim 12, wherein at least one of the first edge or the second edge is programmable to adjust a pulse width for the pulse signal.

14. The interface receiver of claim 1, wherein the first voltage domain comprises a voltage domain for a memory interface for an integrated circuit and wherein the second voltage domain comprises a voltage domain for additional circuitry within the integrated circuit.

15. A method for operating an interface receiver, comprising:

receiving an input signal having a voltage swing around a DC common mode voltage level within a first voltage domain;

passing the input signal through an attenuation network to attenuate the DC common mode voltage level and the voltage swing for the input signal and to output an attenuated signal;

amplifying the attenuated signal to output an amplified signal within a second voltage domain;

generating a pulse signal within the second voltage domain based upon the amplified signal; and controlling operation of the attenuation network at least in part using the pulse signal;

wherein the second voltage domain has a lower supply voltage level than the first voltage domain.

16. The method of claim 15, wherein the controlling step comprises controlling one or more switches within the attenuation network using the pulse signal to connect or disconnect a resistor network within the attenuation network.

17. The method of claim 16, wherein the controlling step comprises controlling the switches using the pulse signal such that the resistor network is connected while the input signal is not transitioning and is disconnected while the input signal is transitioning.

18. The method of claim 15, further comprising adjusting one or more impedances within the attenuation network to adjust attenuation provided by the attenuation network.

19. The method of claim 15, further comprising passing the input signal through an AC coupling network to output an AC component of the input signal, and wherein the amplifying step comprises amplifying a combined signal including the attenuated signal from the attenuation network and the AC component of the input signal from the AC coupling network.

20. The method of claim 19, further comprising adjusting one or more capacitances within the AC coupling network to adjust attenuation provided by the AC coupling network.

* * * * *